United States Patent
Kästner et al.

(10) Patent No.: US 12,130,381 B2
(45) Date of Patent: Oct. 29, 2024

(54) METHODS AND SYSTEMS FOR PROCESSING RADAR REFLECTIONS

(71) Applicant: Aptiv Technologies AG, Schaffhausen (CH)

(72) Inventors: Florian Kästner, Bochum (DE); Markus Schoeler, Wuppertal (DE); Mirko Meuter, Erkrath (DE); Adrian Becker, Leverkusen (DE)

(73) Assignee: Aptiv Technologies AG, Schaffhausen (CH)

( * ) Notice: Subject to any disclaimer, the term of this patent is extended or adjusted under 35 U.S.C. 154(b) by 319 days.

(21) Appl. No.: 16/910,829

(22) Filed: Jun. 24, 2020

(65) Prior Publication Data
US 2021/0018593 A1 Jan. 21, 2021

(30) Foreign Application Priority Data
Jul. 19, 2019 (EP) .................. 19187280

(51) Int. Cl.
*G01S 7/41* (2006.01)
*G01S 13/42* (2006.01)

(52) U.S. Cl.
CPC .............. *G01S 7/411* (2013.01); *G01S 7/415* (2013.01); *G01S 7/417* (2013.01); *G01S 13/42* (2013.01)

(58) Field of Classification Search
CPC .......... G01S 7/411; G01S 7/415; G01S 7/417; G01S 13/42; G01S 13/931; G01S 13/584
See application file for complete search history.

(56) References Cited

U.S. PATENT DOCUMENTS

| | | | | |
|---|---|---|---|---|
| 5,444,864 | A | * | 8/1995 | Smith .................... H04B 1/408 455/24 |
| 8,774,145 | B2 | * | 7/2014 | Lin ......................... H04W 4/21 370/338 |
| 2009/0303103 | A1 | * | 12/2009 | Winstead ............. G01S 13/103 342/89 |
| 2013/0268173 | A1 | * | 10/2013 | Kambe ................. G01S 13/345 701/96 |
| 2013/0300573 | A1 | * | 11/2013 | Brown .................... G01S 13/42 340/870.01 |

(Continued)

FOREIGN PATENT DOCUMENTS

| | | | |
|---|---|---|---|
| DE | 102018203591 B3 | * | 7/2019 |
| EP | 3171553 A1 | * | 5/2017 |
| EP | 3188461 A1 | * | 7/2017 ............. G01S 15/08 |

OTHER PUBLICATIONS

DE_102018203591_B3_I.pdf, translated copy of foreign reference DE_102018203591_B3 (Year: 2019).*

(Continued)

*Primary Examiner* — Timothy A Brainard
*Assistant Examiner* — Kenneth W Good
(74) *Attorney, Agent, or Firm* — Harness, Dickey & Pierce, P.L.C.

(57) ABSTRACT

A computer implemented method for processing radar reflections includes receiving radar reflections by at least one radar sensor; determining a target angle under which radar reflections related to a potential target are received by the at least one radar sensor; and determining an energy of radar reflections received by the at least one radar sensor under a pre-determined angular region around the target angle.

17 Claims, 6 Drawing Sheets

(56) References Cited

U.S. PATENT DOCUMENTS

| | | | |
|---|---|---|---|
| 2016/0054436 A1* | 2/2016 | Lee | G09G 3/20 |
| | | | 345/87 |
| 2016/0377704 A1* | 12/2016 | Harash | G01S 13/0209 |
| | | | 342/21 |
| 2017/0206001 A1* | 7/2017 | Li | G06F 3/04883 |
| 2017/0290011 A1* | 10/2017 | Kushnir | G01S 7/006 |
| 2018/0011169 A1* | 1/2018 | Nakayama | G01S 13/42 |
| 2018/0262163 A1* | 9/2018 | Tokuda | G05F 3/26 |
| 2018/0309474 A1* | 10/2018 | Cheung | G01S 7/52 |
| 2019/0044561 A1* | 2/2019 | Fernando | H01Q 21/29 |
| 2019/0155276 A1* | 5/2019 | Jung | G05D 1/0033 |
| 2019/0155304 A1* | 5/2019 | Choi | G01S 7/414 |
| 2019/0353753 A1* | 11/2019 | Gebhardt | H03M 7/30 |
| 2019/0383904 A1* | 12/2019 | Harrison | G01S 7/0236 |
| 2020/0158861 A1* | 5/2020 | Cattle | G01S 13/89 |
| 2020/0359330 A1* | 11/2020 | Zacharias | H04W 72/23 |
| 2021/0018594 A1* | 1/2021 | Kipp | G01S 7/4052 |
| 2021/0055385 A1* | 2/2021 | Rimini | G01S 7/417 |
| 2021/0055386 A1* | 2/2021 | Rimini | H04B 7/0426 |
| 2021/0116537 A1* | 4/2021 | Takada | G01S 13/04 |
| 2023/0031232 A1* | 2/2023 | Kiilerich Pratas | H04W 24/10 |

OTHER PUBLICATIONS

EP_3171553_A1_I.pdf, translated copy of foreign reference EP_3171553_A1_I.pdf (Year: 2017).*

Partial European Search Report for Application No. EP 19187280.3, dated Jan. 15, 2020.

* cited by examiner

METHODS AND SYSTEMS FOR PROCESSING RADAR REFLECTIONS

CROSS REFERENCE TO RELATED APPLICATION

This application claims priority to European Patent Application No. EP 19187280.3, filed on Jul. 19, 2019.

FIELD

The present disclosure relates to methods and systems for processing radar reflections. The energy of received radar reflections received under a pre-determined angular region around a target angle may be determined, and processing may be carried out on a distributed computing system.

BACKGROUND

Radar is a commonly used sensor in automotive perception systems due to its low cost compared with LiDAR and high adaptability to environment changes (e.g. weather or lighting condition) compared with cameras.

Radar data may be preprocessed to form a point cloud of detections. Each point detection is characterized by some features, e.g. its RCS (reflection magnitude), range rate (Doppler velocity) and spatial location. The methods to get these features represent the preprocessing pipeline which is usually implemented on satellite sensors close to the radar sensor. The resulting features describing the point detection are sent via CAN (Controller Area Network) bus to a central radar perception unit where tracker and classification tasks are applied on these features. The satellite sensors may be provided on one or more first boards, and the central radar perception unit may be provided on a second board. These features are later used to carry out object detection, classification, semantic or instance segmentation based on specific regions covering the point detections.

However, according to conventional methods, performance of object detection, classification, semantic or instance segmentation still may be improved if more meaningful radar data could be provided.

Accordingly, there is a need to provide systems and methods for enhanced radar data processing.

SUMMARY

In one aspect, the present disclosure is directed at a computer implemented method for processing radar reflections. The method includes: receiving radar reflections by at least one radar sensor; determining a target angle under which radar reflections (in other words: radar data) related to a potential target are received by the at least one radar sensor; and determining an energy of radar reflections received by the at least one radar sensor under a pre-determined angular region around the target angle.

In other words, not only energies of radar signals received under the target angle, which is the angle at which a potential target is expected, is considered, but the energies in a pre-determined angular region (in other words: region of angles; in other words: angular range; in other words: range of angles; in other words: angular area; in other words: area of angles; in other words: angular interval; in other words: (one-dimensional or two-dimensional) interval of angles; in other words: area of interest) are determined. The energy of radar reflections received by the at least one radar sensor under the pre-determined angular region around the target angle may be determined by adding (in other words: summing up) all energies of radar signals in the pre-determined angular region.

The target angle may be the angle under which a potential target is expected. The target angle may be provided relative to a coordinate system or relative to a vehicle on which the at least one radar sensor is provided. For example, the coordinate system may be defined by the at least one radar sensor. For example, a forward axis may be defined by the at least one radar sensor. For example, the at least one radar sensor may include a plurality of antennas or a plurality of radar sensors which may be provided along a line, and the forward direction may be defined orthogonal to the line, and directed in a direction where the at least one radar sensor emits and receives signals; for example, if the at least one radar sensor is provided in a vehicle, the forward direction may point to an exterior of the vehicle (in other words: away from an interior of the vehicle).

It has been found that taking into account the energies of radar signals in the angular region provides useful information to improve object detection, classification, and semantic or instance segmentation.

According to another aspect, the energy of the radar reflections received by the at least one radar sensor under the pre-determined angular region around the target angle may be an energy of radar reflections received by the at least one radar sensor under the pre-determined angular region around the target angle and related to a range of the potential target.

Distinguishing angular regions according to a range (in other words: distance) of a potential target may enhance the information content of energy spectrums computed, since targets under a similar angle but with different range may be distinguished.

According to another aspect, the energy of the radar reflections received by the at least one radar sensor under the pre-determined angular region around the target angle may be an energy of radar reflections received by the at least one radar sensor under the pre-determined angular region around the target angle and related to a pre-determined range region around a range of the potential target. It has been found that not only taking into account an angular region, but also a range region may further improve the information for further processing.

According to another aspect, the energy of the radar reflections received by the at least one radar sensor under the pre-determined angular region around the target angle may be an energy of radar reflections received by the at least one radar sensor under the pre-determined angular region around the target angle and related to a Doppler frequency of the potential target.

Distinguishing angular regions according to a Doppler frequency (which is related to velocity) of a potential target may enhance the information content of energy spectrums computed, since targets under a similar angle but with different velocities may be distinguished.

According to another aspect, the energy of the radar reflections received by the at least one radar sensor under the pre-determined angular region around the target angle may be an energy of radar reflections received by the at least one radar sensor under the pre-determined angular region around the target angle and related to a pre-determined Doppler frequency region around the Doppler frequency of the potential target. It has been found that not only taking into account an angular region, but also a Doppler frequency region (which corresponds to a velocity region around the velocity of the potential target) may further improve the information for further processing.

According to another aspect, the computer implemented method may further comprise determining a correlation coefficient between an energy of radar reflections received by the at least one radar sensor under the target angle and the energy of the radar reflections related received by the at least one radar sensor under pre-determined angular region around the target angle.

Taking into account the correlation coefficient between energies of radar reflections related to the target angle (in other words: the angle of the potential target) and the energies in a region around the target angle by improve results. The correlation may provide information as to whether or not the energies in the region around the target angle are actually related to the energy of the target angle.

According to another aspect, a respective energy may be determined for a plurality of ranges of potential targets. According to another aspect, a respective energy may be determined for a plurality of velocities of potential targets.

Determining energies for a plurality of ranges and a plurality of velocities may provide for determining energies for each range-velocity bin in the range-Doppler domain, and may provide a complex data cube with dimensions related to range, to velocity, and to angle (i.e. the angles of potential targets, around which the angular region is formed, in which the energies are determined).

According to another aspect, the computer implemented method may further comprise: providing the energy for a plurality of ranges of potential targets and for a plurality of velocities of potential targets as an energy related feature vector to a neural network for further processing.

It has been found that neural networks provide for efficient further processing, for example object detection, object classification, and/or semantic or instance segmentation.

According to another aspect, the computer implemented method may further comprise: determining further feature vectors based on the radar reflections; and providing the further feature vectors to the neural network.

The neural network may process both the data related to the energies in the angular region (which may be provided in the form of feature vectors; in other words: which may be reformatted to be represented by vectors, which may be referred to as feature vectors) and further feature vectors obtained from other processing, for example conventional feature vectors. It has been found that feature vectors according to various embodiments improve detection results compared to only using conventional feature vectors.

According to another aspect, the radar reflections may comprise channel data received by a plurality of antennas; and determining the energy of the radar reflections received by the at least one radar sensor (for example the plurality of antennas) the pre-determined angular region around the target angle may be based on carrying out a Fourier transform of the channel data received by a plurality of antennas.

Carrying out a Fourier transform (for example a Fast Fourier Transform; FFT) over the last dimension of a complex data cube of range, Doppler and channel information may yield a spectrum that corresponds to an angle. The channel information relates to radar reflections received by different antennas in an antenna array, and therefore include a time shift in the received signal. Carrying out a Fourier transform over these time shifted signals may yield the angular information.

The angular spectrum may be determined by applying a Fourier Transform (for example Fast Four Transform; FFT) over the Channel dimension of the complex data cube for one particular range and Doppler bin pair. This may be called a beamvector and may correspond to the complex response of the antenna arrays element (e.g. the third element of the beamvector may be the measured (complex valued) amplitude at the third antenna element). Due to production inaccuracies, it may be desired to apply a calibration to this beamvector. Since a Fourier transform may require uniformly sampled data, in case of a non uniformly spaced array (depending on the arrays geometry), a transform or interpolation to a uniform linear sampled array (ULA) may be provided.

According to another aspect, a first portion of the computer implemented method may be carried out by a first portion of the hardware components, a second portion of the computer implemented method may be carried out by a second portion of the hardware components, and the first portion of the hardware components may be connected to the second portion of the hardware components via a communication structure.

Separating the hardware components into a first portion and a second portion, connected with each other via a communication structure, may provide a distributed computing system (for example a multi-board computing system).

According to another aspect, the computer implemented method may further include transmitting intermediate data as input for the second portion of the computer implemented method from the first portion of the hardware components to the second portion of the hardware components via the communication structure.

The intermediate data may be data that is partially processed data of reduced size, in order to restrict the communication load on the communication structure. The intermediate data may be data that may be obtained at the first portion of the hardware components with the computational power available at the first portion of the hardware components. There may be a trade-off between the computational power of the first portion of the hardware components and the communication bandwidth of the communication structure; a higher computational power of the first portion of the hardware components may allow to carry out processing that leads to data of reduced size to be communicated, which may decrease the required communication bandwidth of the communication structure; likewise, less computational power of the first portion of the hardware components may lead to a requirement of higher communication bandwidth of the communication structure.

According to another aspect, the computer implemented method may further comprise: encoding intermediate data as input for the second portion of the computer implemented method in the first portion of the hardware components to obtain compressed data of reduced size smaller than a size of the intermediate data, transmitting the compressed data from the first portion of the hardware components to the second portion of the hardware components via the communication structure, and decoding the compressed data in the second portion of the hardware components, and providing the decoded compressed data as input to the second portion of the computer implemented method.

In one aspect, the decoded compressed data may be similar or identical to the intermediate data. For example, the decoded compressed data and the intermediate data may be represented by vectors of identical length, and the norm of the difference between the vector representing the decoded compressed data and the vector representing the intermediate data may be below a pre-determined threshold. A neural network may be trained to provide a high similarity between the decoded compressed data and the intermediate data. In another aspect, the decoded compressed data may include semantically rich dense feature vectors, corresponding to the intermediate data. The intermediate data may be more sparse than the decoded compressed data. Increasing the density of the data in the decoded compressed data may enhance the further processing.

Encoding the intermediate data and decoding the compressed data may be carried out by one or more neural networks, and these one or more neural networks may be trained end to end.

In another aspect, the present disclosure is directed at a computer system, said computer system comprising a plurality of computer hardware components configured to carry out several or all steps of the computer implemented method described herein.

The computer system may comprise a plurality of computer hardware components (for example a processing unit (in other words: processor), at least one memory unit (which may also be referred to as memory), and at least one non-transitory data storage, for example hard disk drive or solid-state drive). It will be understood that further computer hardware components may be provided and used for carrying out steps of the computer implemented method in the computer system. The non-transitory data storage and/or the memory unit may comprise a computer program for instructing the computer to perform several or all steps or aspects of the computer implemented method described herein, for example using the processing unit and the at least one memory unit. The computer system may include the at least one radar sensor.

A first portion of the computer hardware components are provided in a radar sensor unit, and a second portion of the computer hardware components may be provided in a central radar perception unit.

It has been found that processing large amounts of data in the radar sensor unit may allow for only a smaller amount of data having to be transferred to the central radar perception unit. As such, processing which may reduce the amount of data may be computed on the radar sensor unit, and the resulting data may then be transmitted to the central radar perception unit, where further processing, which may be computationally expensive, may be carried out.

In another aspect, the present disclosure is directed at a non-transitory computer readable medium comprising instructions for carrying out several or all steps or aspects of the computer implemented method described herein. The computer readable medium may be configured as: an optical medium, such as a compact disc (CD) or a digital versatile disk (DVD); a magnetic medium, such as a hard disk drive (HDD); a solid state drive (SSD); a read only memory (ROM), such as a flash memory; or the like. Furthermore, the computer readable medium may be configured as a data storage that is accessible via a data connection, such as an internet connection. The computer readable medium may, for example, be an online data repository or a cloud storage.

The present disclosure is also directed at a computer program for instructing a computer to perform several or all steps or aspects of the computer implemented method described herein.

DRAWINGS

Exemplary embodiments and functions of the present disclosure are described herein in conjunction with the following drawings, showing schematically:

DETAILED DESCRIPTION

Figure 1:
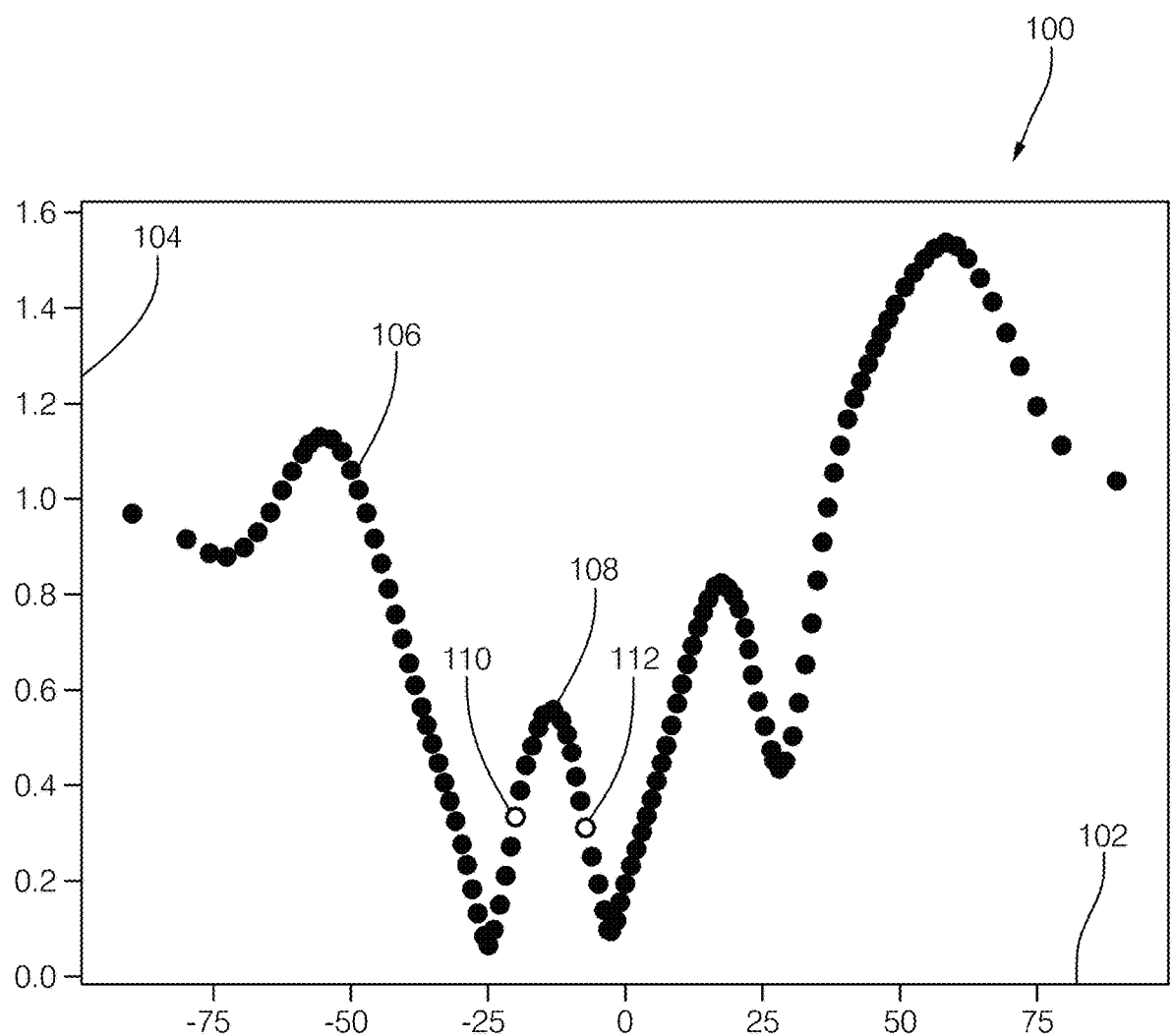
FIG. 1 is an exemplary angle spectrum of a specific range-Doppler bin according to various embodiments.

For point detection processed by the radar, information related to a range [m], angle [°] and a range-rate [m/s] is computed. This information may be determined based on an identified target in the complex data cube (CDC, which may also be referred to as a compressed data cube), which may be represented by a tensor of dimension R×D×C, wherein R is the dimension of the range information, D is the dimension of the range-rate information (for example the Doppler information), and C is the dimension of the channel information (for example the number of antennas, based on which the angle information may be determined).

According to various embodiments, useful features may be extracted from this data by using the neighboring beamvectors (in other words: beamvectors neighboring to the beamvector associated with a potential target) where the reflected energy from an object will also be partially visible. For each range bin in the CDC, several Doppler bins are stored in the CDC. In order to determine how much energy from the object of interest falls into each Doppler bin, a Fourier transform may be determined over the last dimension (i.e. over the channel dimension), which yields a spectrum that corresponds to an angle, and which may be stored in a data cube of dimensions R×D×A, wherein A is the dimension related to the angle (which is the angle under which radar reflections, for example related to (or from) a potential target, are received, for example by at least one radar sensor).

A region of interest may be defined in this angular spectrum (for example a pre-determined energy bandwidth, for example a 3 dB bandwidth) around the peak (in other words: the energy peak) that belongs to the target of interest. Based on the region of interest, for example the pre-determined energy bandwidth, the closest bins in the spectrum within that bandwidth may be determined. For example, for a 3 dB bandwidth, angles $\Theta_{3\ dB-}$ and $\Theta_{3\ dB+}$ may be determined so that the energy of radar reflections for each angle in the angular region between $\Theta_{3\ dB-}$ and $\Theta_{3\ dB+}$ lies within 3 dB of the energy of the target angle. The angles between $\Theta_{3\ dB-}$ and $\Theta_{3\ dB+}$ may be used for determining the energy in the region of interest, and the energy between $\Theta_{3\ dB+}$ and $\Theta_{3\ dB-}$ may be accumulated (in other words: added; in other words: summed up) along the Doppler dimension to get an energy distribution over Doppler bin. For example, the following formula may be used to determine an average energy in the region of interest:

$$E_{r,\theta}(d) = \frac{1}{N_\theta} \sum_{\theta_{3dB-}}^{\theta_{3dB+}} S(r, d, \theta)$$

wherein r denotes the range bin, $\Theta$ denotes the angle bin, d denotes the velocity (or Doppler bin), $N_\Theta$ denotes the number of angle bins between $\Theta_{3\ dB+}$ and $\Theta_{3\ dB-}$, and $S(r,d,\Theta)$ is the Fourier transform (for example determined using a Fast Fourier Transform; FFT) of the CDC along the channel axis. It will be understood that although the above formula illustrates the accumulation using a one-dimensional sum (for a 2D radar), also a two-dimensional sum (for a 3D radar) may be used.

FIG. 1 shows an exemplary angle spectrum 100 of a specific range-Doppler bin according to various embodiments. A plurality of points 106 in angle spectrum 100 illustrate energies 104 of reflected signals over angles 102. A target 108 may be determined, for example by an arbitrary frequency estimation method. This determination may be carried out before the targets local energy is determined. Then, the energies related to angles in the region of interest, for example between point 110 (for example $\Theta_{3\ dB-}$) and point 112 (for example $\Theta_{3\ dB+}$, may be averaged using the above formula.

According to various embodiments, a correlation coefficient between the peak 108 and the adjacent bins (along the Doppler dimension but in range-Doppler-map domain) may be determined to weight the energy distribution.

According to various embodiments, the energy may be accumulated for the neighbouring range bins as well.

The energy distributions position may be corrected along the abscissa with respect to the ego motion of the observer (for example of the car) on which the radar sensors are mounted.

The energy distributions may be used as (CDC) features for object detection, for example for object classification.

The CDC features which have been extracted per point detection, can be used in combination with point features to classify objects with the help of end-to-end trainable neuronal networks. This may be referred to as feature embedding.

Figure 2:
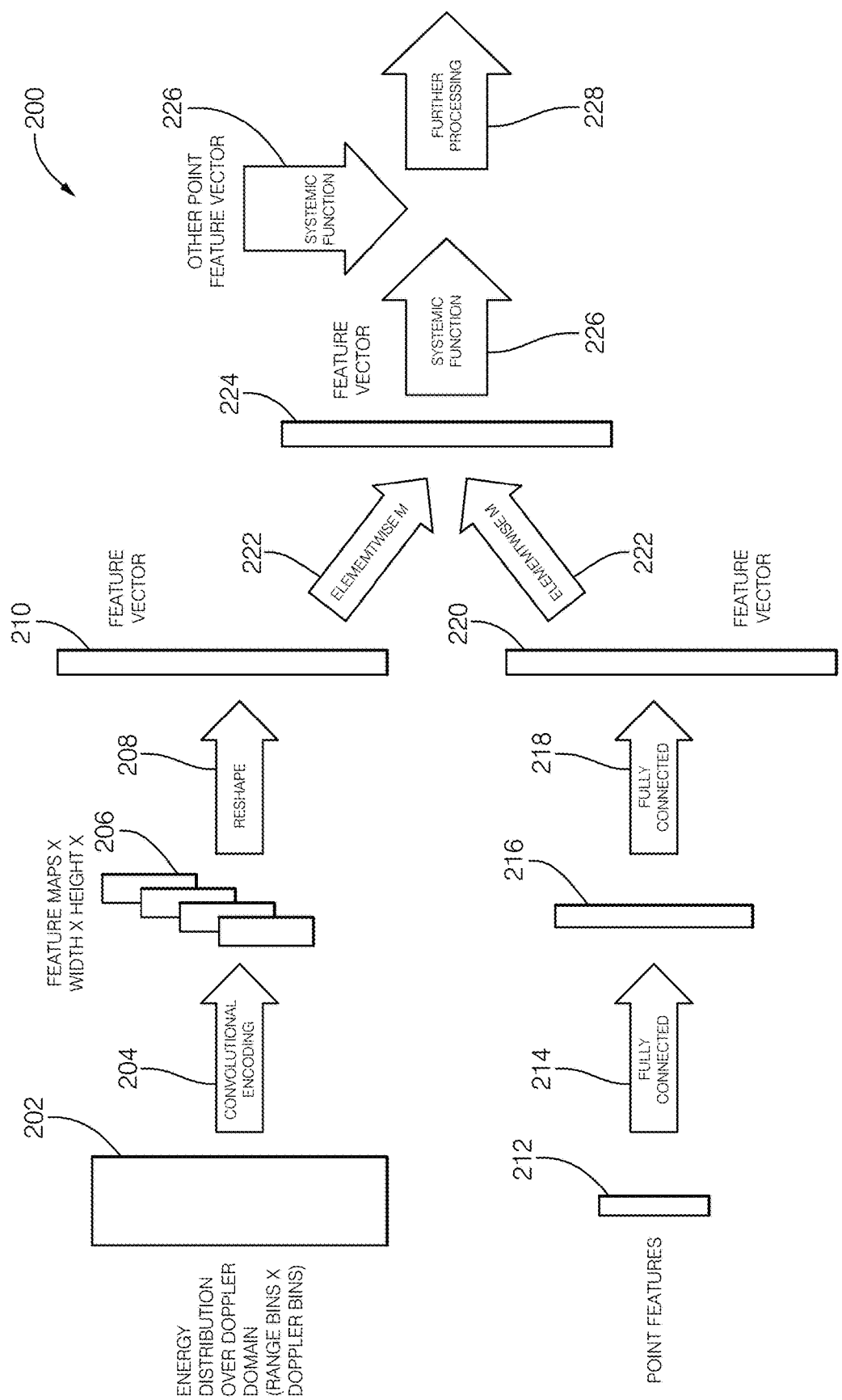
FIG. 2 is a scheme of a network according to various embodiments.

FIG. 2 shows a scheme 200 of a network according to various embodiments. The CDC features which may have been determined as described above may be provided as an energy distribution 202 over the Doppler domain (for example as a matrix of dimensions equal to the number of Range bins times the number of Doppler bins). A 2-D convolutional feature encoding 204 may be applied on the (weighted) energy distribution 202 for each point. After several convolution, pooling and activation function pairs, semantically enriched feature maps 206 with fixed width and channel size may be created. The maps 206 may undergo a reshape processing 208, to obtain a feature vector 210.

Further point features 212 may be processed by several fully connected layers (for example a first fully connected layer 214 to obtain a first processed feature vector 216 and a second fully connected layer 218 to obtain a feature vector 220 that is of the same shape as the feature vector 210) to encode the point features 212 and bring them to the same shape as the reshaped CDC feature map (in other words: the feature vector 210).

An element-wise multiplication 222 is used to mask the CDC feature map 206 (in the form of feature vector 210) using the other feature vector 220 to get a masked feature vector 224.

Each point may be processed individually using the same network with shared weights. In order to determine whether an object is within a region proposal, the features from points within the region proposal need to be combined. This may be achieved this with a commutative (in other words: symmetric) function 226, which may provide element-wise accumulation, and which may ensure invariance to permutation of the points. A region proposal may also be referred to as an anchor.

An additional network may be used for further processing 228 of these combined features. It will be understood that this further processing 228 may be carried out according to a conventional processing, and that the various embodiments are not limited to a specific way of further processing 228. Likewise, the various embodiments are not limited to a specific source of the region proposals as well as the preprocessing of the point detections it combines.

Usually the CDC data is not transmitted from the satellite sensors to the radar perception unit because of bandwidth limitations.

Figure 3:
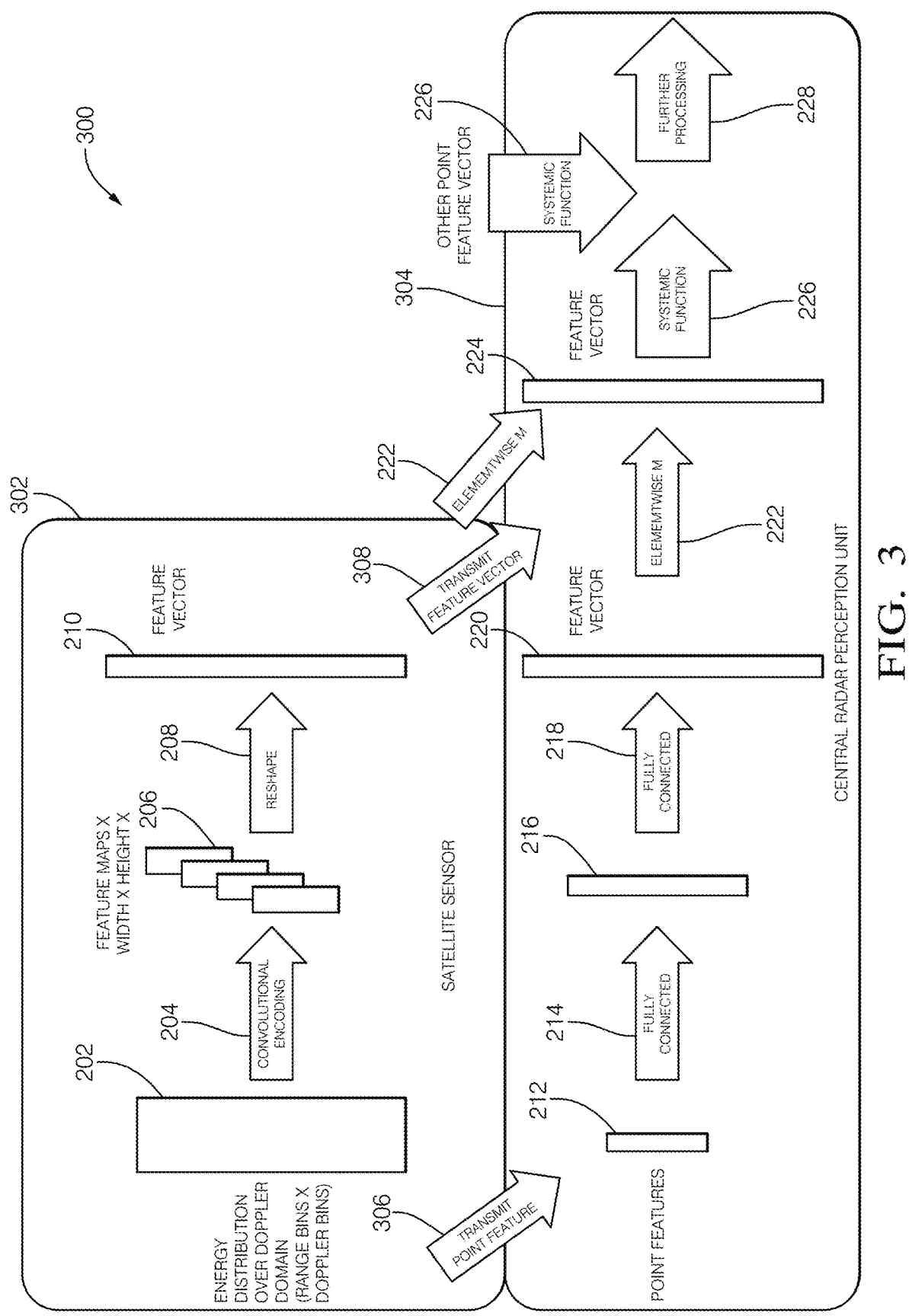
FIG. 3 is a split network according to various embodiments.

FIG. 3 shows a split network 300 according to various embodiments. Various components of the split network 300 are similar or identical to components of the network 200 illustrated in FIG. 2, so that the same reference signs may be used and duplicate description may be omitted. The network 300 (i.e. the split network) may be split to implement a first portion of the network 300 on one or more satellite sensors 302, and to implement a second portion of the network 300 (for example the remaining portion of the network 300) on a central perception unit 304. The training of the network may be carried out in a combined network. The network may be split after training. The conventional point features may be transmitted from the satellite sensor 302 to the central radar perception unit 304, like indicated by arrow 306. The feature vector 210, representing the feature maps 206, may be transmitted from the satellite sensor 302 to the central radar perception unit 304, like indicated by arrow 308.

To further reduce the communication overhead, an end-to-end trainable autoencoding method may be provided to compress the information prior to sending it over the CAN (Controller Area Network) bus. This network may include two parts, one running on the satellites and the other running on the perception unit. On the satellites, CDC feature vectors are encoded to smaller sized feature vectors. These vectors are then transferred and decoded on the perception unit without too much loss of information.

Figure 4:
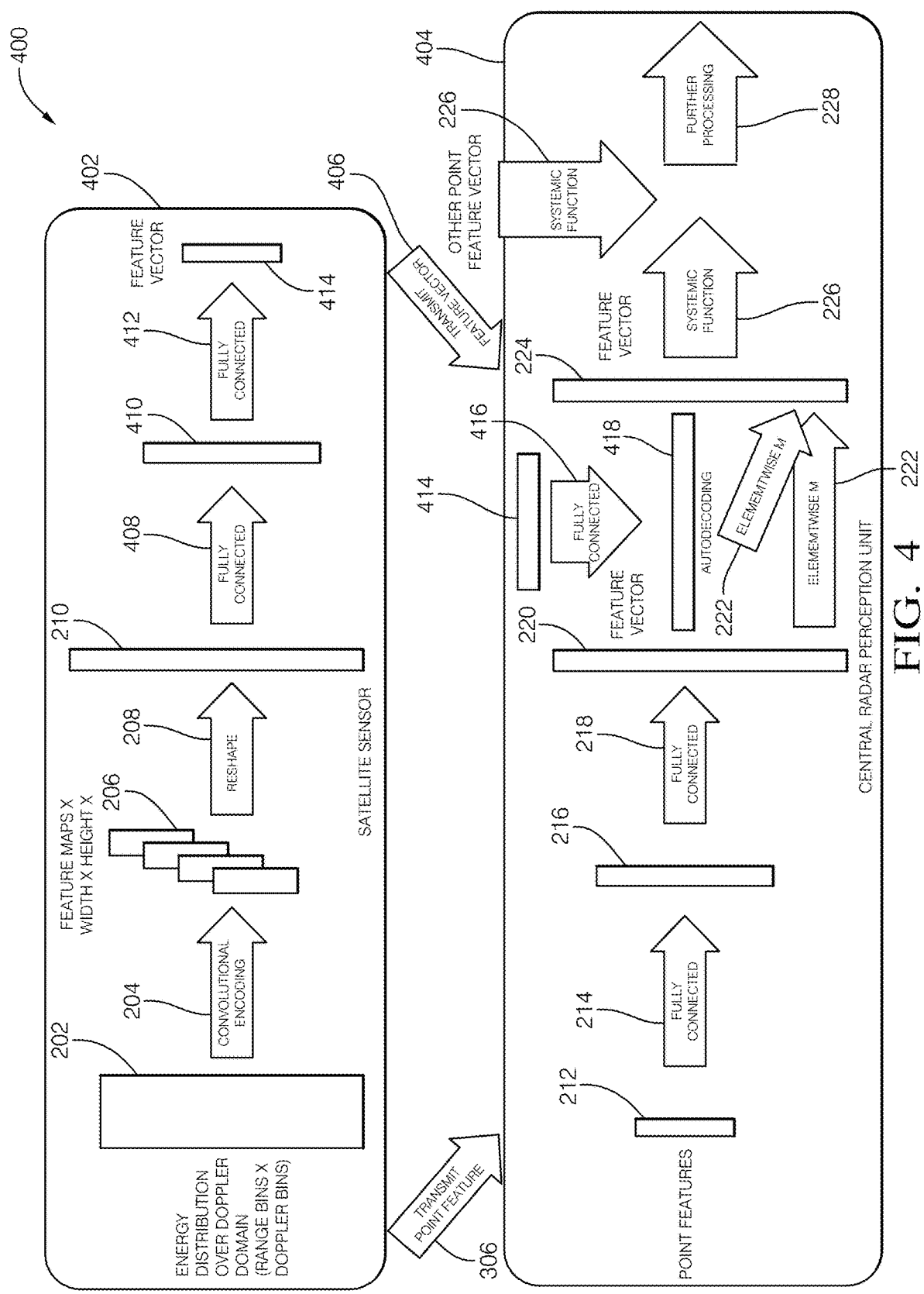
FIG. 4 is a split network with autoencoder functionality according to various embodiments.

FIG. 4 shows a split network 400 with autoencoder functionality according to various embodiments. Various components of the split network 400 with autoencoder are similar or identical to components of the network 200 illustrated in FIG. 2 or of the network 300 illustrated in FIG. 3, so that the same reference signs may be used and duplicate description may be omitted. The satellite sensor 402 may be similar to the satellite sensor 302 of FIG. 3, but may further include autoencoding functionality, according to which the feature vector 210 is reduced in size by one or more fully connected layers (for example a first fully connected layer 408 may reduce the size to obtain a feature vector 410, which may further be applied to a second fully connected layer 412, to obtain a feature vector 414. The feature vector 414 may be smaller in size than the feature vector 210. The feature vector 414 (which may be referred to as intermediate data) may then be transmitted from the satellite sensor 402 to the central radar perception unit 404, like indicated by arrow 406. The central radar perception unit 404 may be similar to the central radar perception unit 304 of FIG. 3, but may include autodecoding functionality. In the central radar perception unit 404, the received (encoded) feature vector 414 may be decoded, for example using a fully connected layer 416, to obtain a decoded feature vector 418 (which may be close to or identical to the original feature vector 210 before encoding). For example, a norm of the difference between the original feature vector 210 and the decoded feature vector 418 may be below a pre-determined threshold. For example, the size of the encoded feature vector 414 may be chosen so that the pre-determined threshold may be met (for example, if it is determined that the difference between the original feature vector 210 and the decoded feature vector 418 may be larger than the a pre-determined threshold, the size of the encoded feature vector 414 may be increased to allow more information to be encoded, and to lead to a better similarity between the original feature vector 210 and the decoded feature vector 418).

The autoencoding functionality of the satellite sensor 402 and the autodecoding functionality of the central radar perception unit 404 may provide a feature vector 414 of smaller size compared to the feature vector 210, which may reduce communication load when transmitting the feature vector 414 (instead of the feature vector 210) from the satellite sensor 402 to the central radar perception unit 404.

Figure 5:
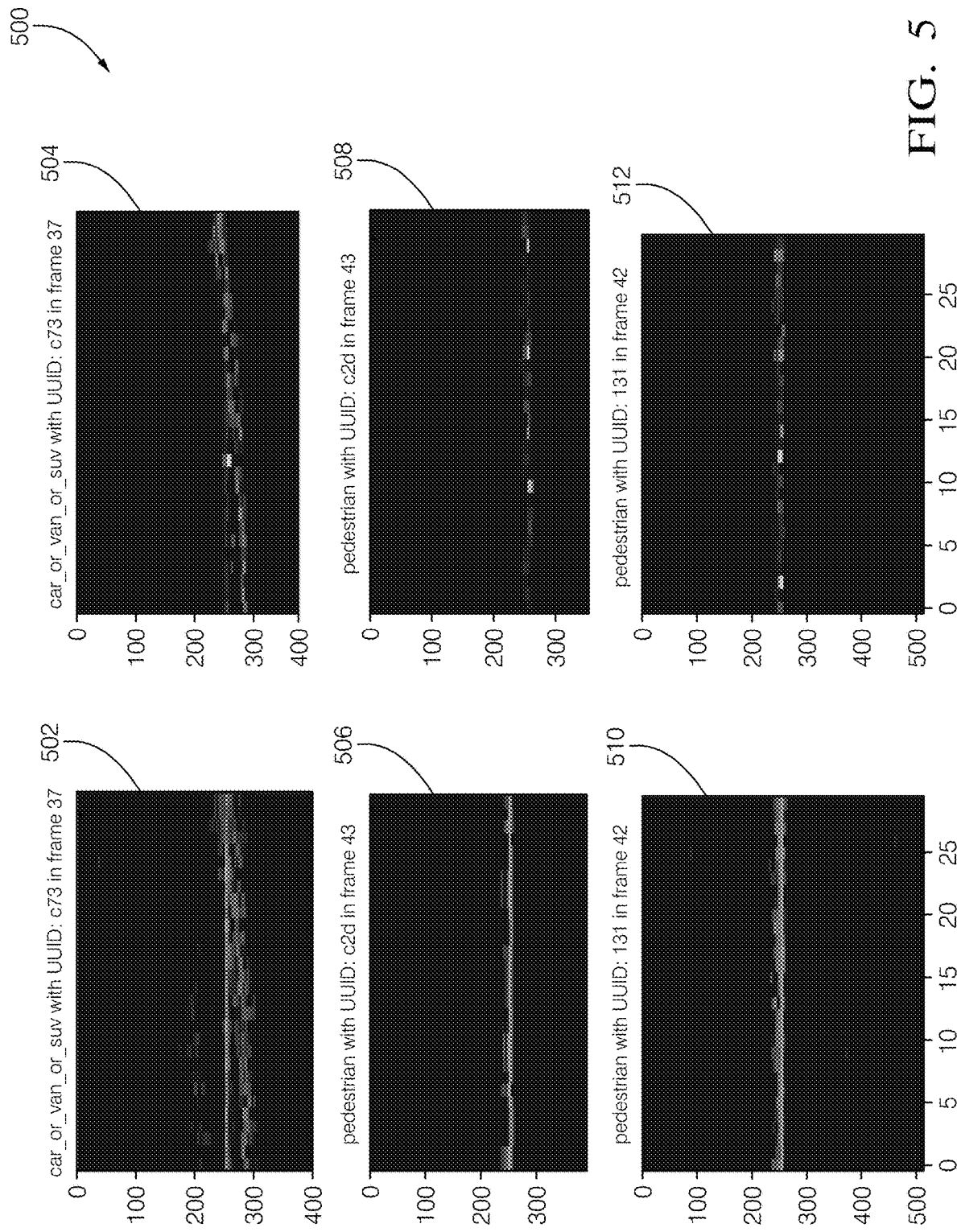
FIG. 5 is an illustration of spectrograms comparing methods according to various embodiments with conventional methods.

FIG. 5 shows an illustration 500 of spectrograms comparing methods according to various embodiments with conventional methods. Spectrograms 502, 506, and 510 in the left portion of FIG. 5 illustrate Doppler spectrograms obtained using conventional methods, and spectrograms 504, 508, and 512 in the right portion of FIG. 5 illustrate spectrograms obtained with systems and methods according to various embodiments. The horizontal axes in FIG. 5 illustrate time, the vertical axes illustrated frequency.

The method according to various embodiments, including the feature encoding according to various embodiments, shows a better signature, suppressing most of the clutter so that the classifier can perform better as compared to conventional methods. Table 1 provides performance results of the classifier using the method according to various embodiments.

TABLE 1

|  | precision | recall | f1-score | support |
|---|---|---|---|---|
| bicycle | 0.50 | 0.10 | 0.16 | 52 |
| car_or_van_or_suv | 0.96 | 0.94 | 0.95 | 3046 |
| pedestrian | 0.81 | 0.80 | 0.81 | 887 |
| avg/total | 0.92 | 0.90 | 0.91 | 3985 |

For the results of Table 1, bicycle, car_or_van_or_suv, and pedestrian are classes into which detected objects are to be classified. Precision indicates the ratio tp/(tp+fp) where tp is the number of true positives and fp the number of false positives. The precision is intuitively the ability of the classifier not to label as positive a sample that is negative. Recall is the ratio tp/(tp+fn) where tp is the number of true positives and fn the number of false negatives. The recall is intuitively the ability of the classifier to find all the positive samples. The f1-score provides the harmonic mean of precision and recall. support is the number of samples of the true response that lie in that class. The line labeled 'avg/total' in Table 1 includes the weighted average of precision, recall and f1-score, where the weights are the support values.

Without using the method according to various embodiments, the performance drops to a f1-score of 0.68.

Figure 6:
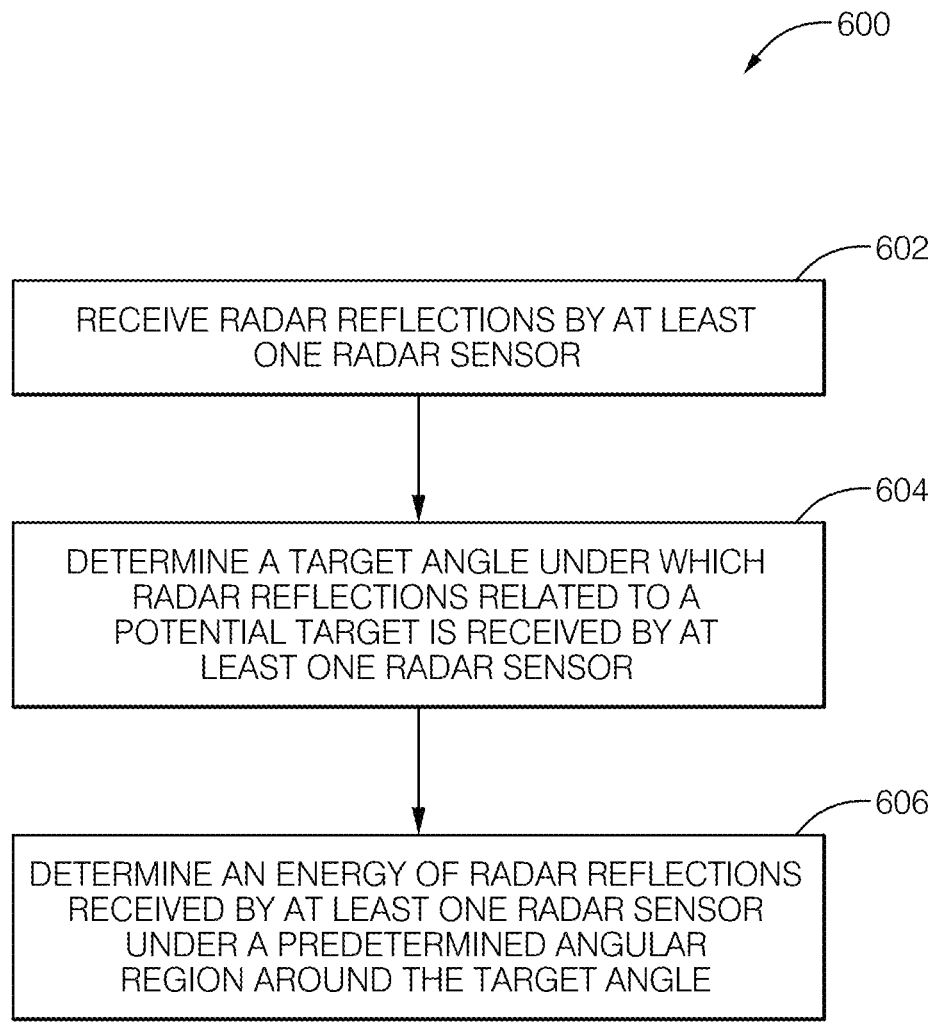
FIG. 6 is a flow diagram illustrating a computer implemented method for processing radar reflections according to various embodiments.

FIG. 6 shows a flow diagram 600 illustrating a computer implemented method for processing radar reflections according to various embodiments. At 602, radar reflections may be received by at least one radar sensor. At 604, a target angle under which radar reflections related to a potential target are received by the at least one radar sensor. At 606, an energy of radar reflections received by the at least one radar sensor under a pre-determined angular region around the target angle.

According to various embodiments, the energy of the radar reflections received by the at least one radar sensor under the pre-determined angular region around the target angle may be an energy of radar reflections received by the at least one radar sensor under the pre-determined angular region around the target angle and related to a range of the potential target.

According to various embodiments, the energy of the radar reflections received by the at least one radar sensor under the pre-determined angular region around the target angle may be an energy of radar reflections received by the at least one radar sensor under the pre-determined angular region around the target angle and related to a pre-determined range region around a range of the potential target.

According to various embodiments, the computer implemented method may further include determining a correlation coefficient between an energy of radar reflections received by the at least one radar sensor under the target angle and the energy of radar reflections received by the at least one radar sensor under the pre-determined angular region around the target angle.

According to various embodiments, a respective energy is determined for a plurality of ranges of potential targets. According to various embodiments, a respective energy is determined for a plurality of velocities of potential targets.

According to various embodiments, the computer implemented method may further include providing the energy for a plurality of ranges of potential targets and for a plurality of velocities of potential targets as an energy related feature vector to a neural network for further processing.

According to various embodiments, the computer implemented method may further include: determining further feature vectors based on the radar reflections; and providing the further feature vectors to the neural network.

According to various embodiments, the radar reflections may include channel data received by a plurality of antennas, and determining the energy of the radar reflections received by the at least one radar sensor under the pre-determined angular region around the target angle may be based on carrying out a Fourier transform of the channel data received by a plurality of antennas.

According to various embodiments, a first portion of the computer implemented method is carried out by a first portion of the hardware components, and a second portion of the computer implemented method is carried out by a second portion of the hardware components. The first portion of the hardware components may be connected to the second portion of the hardware components via a communication structure.

According to various embodiments, the computer implemented method may further include transmitting intermediate data as input for the second portion of the computer implemented method from the first portion of the hardware components to the second portion of the hardware components via the communication structure.

According to various embodiments, the computer implemented method may further include encoding intermediate data as input for the second portion of the computer implemented method in the first portion of the hardware components to obtain compressed data of reduced size smaller than a size of the intermediate data, transmitting the compressed data from the first portion of the hardware components to the second portion of the hardware components via the communication structure, and decoding the compressed data in the second portion of the hardware components, and providing the decoded compressed data as input to the second portion of the computer implemented method.

Each of the steps 602, 604, 606 and the further steps described above may be performed by computer hardware components.

As described above, according to various embodiments, systems and methods for radar CDC data feature encoding for multi-board level solutions may be provided. According to various embodiments, systems and methods may be provided for generating new point features correlating CDC data of main and neighbouring beamvectors.

Radar CDC (Complex Data Cube) data contains useful information to improve detection and classification performance. The CDC contains discrete radar energy responses as beamvectors after a 2-D-FFT in range and Doppler direction and a CFAR-Thresholding (constant false alarm rate thresholding) is applied. In order to use super resolution methods, according to various embodiments, not only the beamvectors of the peaks but also neighbouring beamvectors are kept. Therefore, more useful information may be extracted knowing the relationship between the main and neighbouring beamvectors.

Furthermore, according to various embodiments, a set of possible feature encodings may be provided in order to encode these features to a small feature vector for each point enabling the transfer this data over CAN bus. This encoding may be learned in an end-to-end manner.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A computer implemented method for processing radar reflections, the method comprising:
   receiving radar reflections by at least one radar sensor;
   determining a target angle under which radar reflections from a potential target are received by the at least one radar sensor;
   determining a target angle energy and a Doppler frequency of the radar reflections received by the at least one radar sensor at the target angle;
   determining a velocity of the potential target based on the Doppler frequency of the radar reflections recited by the at least one radar sensor at the target angle;
   determining a region of interest including the target angle and an angular region on each side of the target angle;
   determining a Doppler frequency region that corresponds to a predetermined velocity region around the velocity of the potential target;
   determining an energy of radar reflections received by the at least one radar sensor within the Doppler frequency region at each of a plurality of angles within the region of interest including the target angle and the determined angular region on each side of the target angle;
   determining a total accumulated energy in the region of interest and within the Doppler frequency region by summing the target angle energy and each of the energies of the radar reflections within the Doppler frequency region at the plurality of angles within the region of interest; and
   at least one of detecting and classifying the potential target based on the total accumulated energy in the region of interest and within the Doppler frequency region.

2. The computer implemented method of claim 1, wherein the energy of the radar reflections received by the at least one radar sensor within the determined angular region is related to a range of the potential target.

3. The computer implemented method of claim 1, wherein the energy of the radar reflections received by the at least one radar sensor within the determined angular region is related to a pre-determined range region around a range of the potential target.

4. The computer implemented method of claim 1, further comprising determining a correlation coefficient between the target angle energy and the determined energy at the plurality of angles within the determined angular region.

5. The computer implemented method of claim 1, further comprising determining a respective energy for a plurality of ranges of potential targets.

6. The computer implemented method of claim 1, further comprising determining a respective energy for a plurality of velocities of potential targets.

7. The computer implemented method of claim 1, further comprising providing an energy for a plurality of ranges of potential targets and for a plurality of velocities of potential targets as an energy related feature vector to a neural network for further processing.

8. The computer implemented method of claim 7, further comprising
   determining further feature vectors based on the radar reflections; and
   providing the further feature vectors to the neural network.

9. The computer implemented method of claim 1, wherein the radar reflections comprise channel data received by a plurality of antennas; and
   determining the energy of the radar reflections received by the at least one radar sensor within the determined angular region around the target angle is based on carrying out a Fourier transform of the channel data received by the plurality of antennas.

10. The computer implemented method of claim 1, wherein
    a first portion of the computer implemented method is performed by a first portion of computer hardware components;
    a second portion of the computer implemented method is performed by a second portion of the computer hardware components; and
    the first portion of the computer hardware components are connected to the second portion of the computer hardware components via a communication structure.

11. The computer implemented method of claim 10, comprising transmitting intermediate data as input for the second portion of the computer implemented method from the first portion of the computer hardware components to the second portion of the computer hardware components via the communication structure.

12. The computer implemented method of claim 10, comprising:
    encoding intermediate data as input for the second portion of the computer implemented method in the first portion of the computer hardware components to obtain compressed data of a reduced size smaller than a size of the intermediate data;

transmitting the compressed data from the first portion of the computer hardware components to the second portion of the computer hardware components via the communication structure;

decoding the compressed data in the second portion of the computer hardware components; and providing the decoded compressed data as input to the second portion of the computer implemented method.

13. A computer system, comprising a plurality of computer hardware components configured to perform the computer implemented method of claim 1.

14. The computer system of claim 13,
wherein a first portion of the computer hardware components is provided in a radar sensor unit; and
wherein a second portion of the computer hardware components is provided in a central radar perception unit.

15. A non-transitory computer readable medium comprising instructions that when executed by at least one processor cause the at least one processor to perform the computer implemented method of claim 1.

16. The computer implemented method of claim 1, wherein the at least one of the detecting and classifying the potential target based on the total accumulated energy in the region of interest and within the Doppler frequency region at the plurality of angles within the region of interest comprises determining an average energy based on the total accumulated energy and using the determined average for the at least one of the detecting and classifying.

17. The computer implemented method of claim 1, wherein the target angle corresponds to an energy peak of the radar reflections from the potential target and wherein determining the region of interest includes determining the angular region on each side of the target region such that the energy of radar reflections at each angle in the angular region lies within a predetermined energy bandwidth from the energy peak.

* * * * *